(12) United States Patent
Dhanasekaran

(10) Patent No.: US 8,717,097 B2
(45) Date of Patent: May 6, 2014

(54) AMPLIFIER WITH IMPROVED NOISE REDUCTION

(75) Inventor: Vijayakumar Dhanasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 137 days.

(21) Appl. No.: 13/235,273

(22) Filed: Sep. 16, 2011

(65) Prior Publication Data

US 2013/0002348 A1 Jan. 3, 2013

Related U.S. Application Data

(60) Provisional application No. 61/502,266, filed on Jun. 28, 2011.

(51) Int. Cl.
*H03F 1/14* (2006.01)

(52) U.S. Cl.
USPC .............. 330/51; 330/260; 330/311; 330/69; 381/94.5

(58) Field of Classification Search
USPC ..................... 330/51, 260, 311, 69; 381/94.5
See application file for complete search history.

(56) References Cited

U.S. PATENT DOCUMENTS

| | | | | |
|---|---|---|---|---|
| 4,061,984 A | * | 12/1977 | Zirwas | 330/149 |
| 4,155,041 A | * | 5/1979 | Burns et al. | 455/501 |
| 4,308,425 A | * | 12/1981 | Momose et al. | 381/92 |
| 5,914,591 A | * | 6/1999 | Yasuda et al. | 323/284 |
| 6,344,774 B2 | * | 2/2002 | Ghiozzi et al. | 330/51 |
| 6,389,139 B1 | * | 5/2002 | Curtis et al. | 381/105 |
| 6,472,934 B1 | * | 10/2002 | Pehlke | 330/10 |
| 6,995,701 B1 | * | 2/2006 | Churchill et al. | 341/154 |
| 7,068,096 B2 | * | 6/2006 | Chu | 330/10 |
| 7,417,508 B1 | * | 8/2008 | Quaglietta | 330/302 |
| 2003/0044027 A1 | * | 3/2003 | Tsuji et al. | 381/104 |
| 2006/0220747 A1 | * | 10/2006 | Kiji | 330/308 |
| 2008/0258809 A1 | | 10/2008 | Yen | |
| 2009/0245541 A1 | | 10/2009 | Wang | |

FOREIGN PATENT DOCUMENTS

EP 2317644 A1 5/2011

OTHER PUBLICATIONS

International Search Report and Written Opinion—PCT/US2012/044702—ISA/EPO—Oct. 30, 2012.

* cited by examiner

*Primary Examiner* — Patricia Nguyen
(74) *Attorney, Agent, or Firm* — Ramin Mobarhan

(57) ABSTRACT

An amplifier with improved noise reduction is disclosed. In one implementation, an amplifier is provided that includes a main output stage configured to output an amplified signal at a main output terminal, a secondary output stage configured to output a copy of the amplified signal at a secondary output terminal, and a signal coupler configured to provide a variable resistance coupling between the secondary output terminal and the main output terminal to reduce noise at the main output terminal.

20 Claims, 7 Drawing Sheets

AMPLIFIER WITH IMPROVED NOISE REDUCTION

CLAIM TO PRIORITY

This patent application claims the benefit of priority from U.S. Provisional Patent Application No. 61/502,266, entitled "AMPLIFIER WITH NOISE REDUCTION" filed on Jun. 28, 2011, and assigned to the assignee hereof and hereby expressly incorporated by reference herein.

BACKGROUND

1. Field

The present application relates generally to the operation and design of amplifiers, and more particularly, to amplifiers with improved noise reduction.

2. Background

There is an increasing demand to provide high quality audio and video from a variety of user devices. For example, handheld devices are now capable of rendering high definition video and outputting high quality multichannel audio. Such devices typically require audio amplifiers that are designed to provide high quality signal amplification.

Click and pop noise (CnP) during startup and/or shutdown is a common problem in audio amplifiers. Various factors contribute to generating this type of noise, for example, glitches produced during power-up and power-down, amplifier offset voltages, and glitches or voltage offsets associated with the signal source. Extremely low levels of click and pop noise (i.e., less than 100 micro volts) may be needed especially for headphone amplifiers.

Therefore, it is desirable to have an amplifier with improved noise reduction.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In an exemplary embodiment, an amplifier having main and secondary output stages is provided. A waveform generator also is provided that outputs a coupling waveform that controls a resistive coupling between the secondary output stage and the main output stage during startup and shutdown operations to reduce noise at the amplifier output terminal. The waveform generator also enables/disables other circuit functions to facilitate noise reduction.

Figure 1:
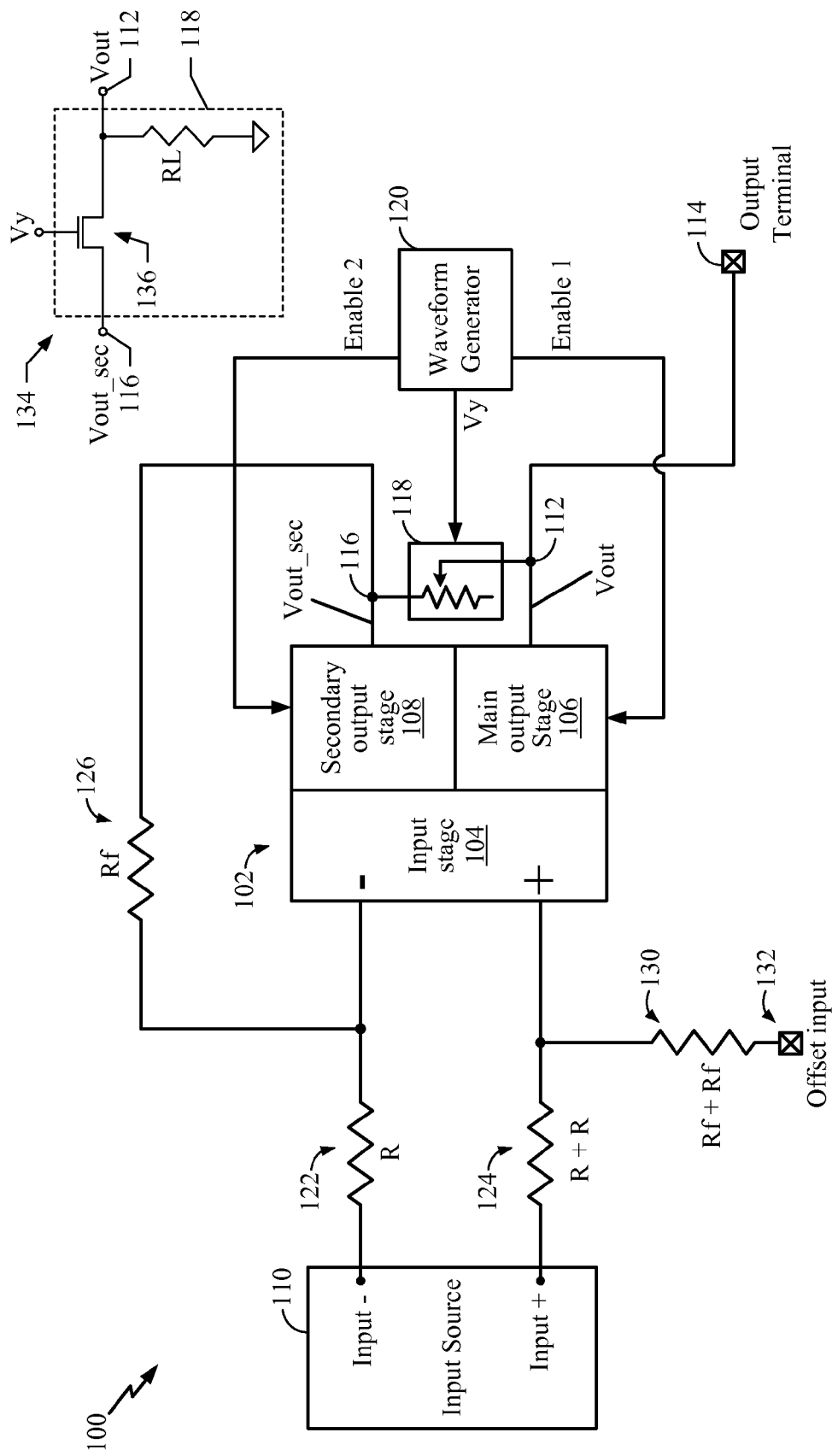
FIG. 1 shows an exemplary circuit that provides amplifier noise reduction in accordance with the various embodiments.

FIG. 1 shows an exemplary circuit 100 that provides an amplifier with noise reduction in accordance with the various embodiments. For example, the circuit 100 is suitable for use in a device to provide audio signal amplification with noise reduction. The circuit 100 comprises an amplifier 102 that comprises an input stage 104 coupled to both of a main output stage 106 and a secondary output stage 108. The input stage 104 is connected to receive an input signal, which in one implementation comprises an audio signal to be amplified. The input signal is provided by an input source 110. The input stage 102 amplifies the input signal to generate an intermediate signal that is coupled to both the main 106 and secondary 108 output stages. Although described as a single input stage, in other implementations, the input stage 102 comprises multiple stages.

The main output stage 106 is configured to amplify the intermediate signal to produce a main amplified signal (Vout) at a main output terminal 112. The main output terminal 112 is connected to an amplifier output terminal 114 that allows the amplified signal to be routed to other circuit components. The secondary output stage 108 is configured to amplify the intermediate signal to produce a secondary amplified signal (Vout_sec) at a secondary output terminal 116. The secondary amplified signal is a copy (or a second version) of the main amplified signal.

The main output terminal 112 and the secondary output terminal 116 are connected to a signal coupler 118. In various implementations, the signal coupler 118 comprises an NMOS transistor, PMOS transistor (or a combination of both) with a gate terminal connected to Vy and source/drain terminals connected to the main output terminal 112 and the secondary output terminal 116. For example, the detailed view 134 illustrates an exemplary implementation of the signal coupler 118. The transistor 136 is connected to a load resistor RL and to the various signal terminals as shown. It should be noted that other implementations of the signal coupler are possible.

The signal coupler 118 provides a variable coupling resistance between the secondary output terminal 116 and the main output terminal 112. The signal coupler 118 operates to set the coupling resistance based on a coupling waveform (Vy) that is received from a waveform generation 120. For example, as the voltage level of the coupling waveform Vy increases, the coupling resistance of the signal coupler 118 decreases thereby adjusting how the secondary amplified signal at terminal 116 is coupled to appear at the main output terminal 112. Thus, it is possible for the coupling waveform Vy to set the resistance of the signal coupler 118 to a minimum resistance value to provide full coupling and to a maximum resistance value to provide full uncoupling.

The main output stage 106 is configured to receive a first enable signal (Enable 1) that enables/disables the operation of the main output stage 106. In the disabled state, the main output stage 106 is in a high impedance state. The secondary output stage 108 is configured to receive a second enable signal (Enable 2) that enables/disables the operation of the secondary output stage 108. In the disabled state, the secondary output stage 108 is in a high impedance state. In an exemplary embodiment, the secondary output stage 108 and signal coupler 118 have a topology that is chosen such that offset contributors remain substantially the same as the main output stage 106.

The input signal to be amplified is coupled to input resistances 122 and 124. The output of the resistance 122 is connected to an inverting input of the input stage 104. A feedback resistor 126 is connected between the secondary output terminal 116 of the secondary output stage 108 and the inverting input of the input stage 104. The output of the resistance 124 is connected to the non-inverting input of the input stage 104. A resistance 130 is coupled to receive an offset input voltage that appears at terminal 132. The resistance 130 is also connected to the non-inverting input of the input stage 104.

During amplifier startup (also referred to herein as power-up) and shutdown (also referred to herein as power-down) operations, the main 106 and secondary 108 output stages are controlled to reduce noise at the output terminal 114. For example, the two stages are controlled to reduce click and pop noise so that this noise does not appear at the amplifier output terminal 114. During operation, one or more of the following functions are performed at power-up to amplify an input signal and reduce noise at the amplifier output terminal 114.
1. The main output stage 106 is disabled and the secondary output stage 108 is enabled.
2. The secondary output terminal 116 is coupled to the main output terminal 112 based on a coupling waveform output from the waveform generator 120.
3. During coupling based on the coupling waveform, click and pop noise at the amplifier output terminal 114 is reduced.
4. After a selected coupling interval completes, the main output stage 106 is enabled and the secondary output stage 108 is disabled.

Similarly, during power-down, one or more of the following functions are performed to reduce noise at the amplifier output terminal 114.
1. The secondary output stage 108 is enabled and the main output stage 106 is disabled.
2. The secondary output terminal 116 is de-coupled from the main output terminal 112 based on a coupling waveform output from the waveform generator.
3. During de-coupling based on the coupling waveform, click and pop noise at the amplifier output terminal 114 is reduced.
4. After a selected de-coupling interval completes, the secondary output stage 108 is disabled.

Therefore, even though it may not be possible in practice to eliminate all noise sources, the circuit 100 operates to reduce noise and decouple it from the amplifier output. Thus, noise that appears at the secondary output stage is decoupled from the amplifier output due to operation of the signal coupler 118. Even if signal offsets exist, this noise can be ramped into the amplifier output in a gradual fashion by the coupling waveform so that the noise is effectively filtered and/or reduced. A more detailed description of the operation of the circuit 100 to achieve signal amplification with noise reduction is provided below.

Figure 2:
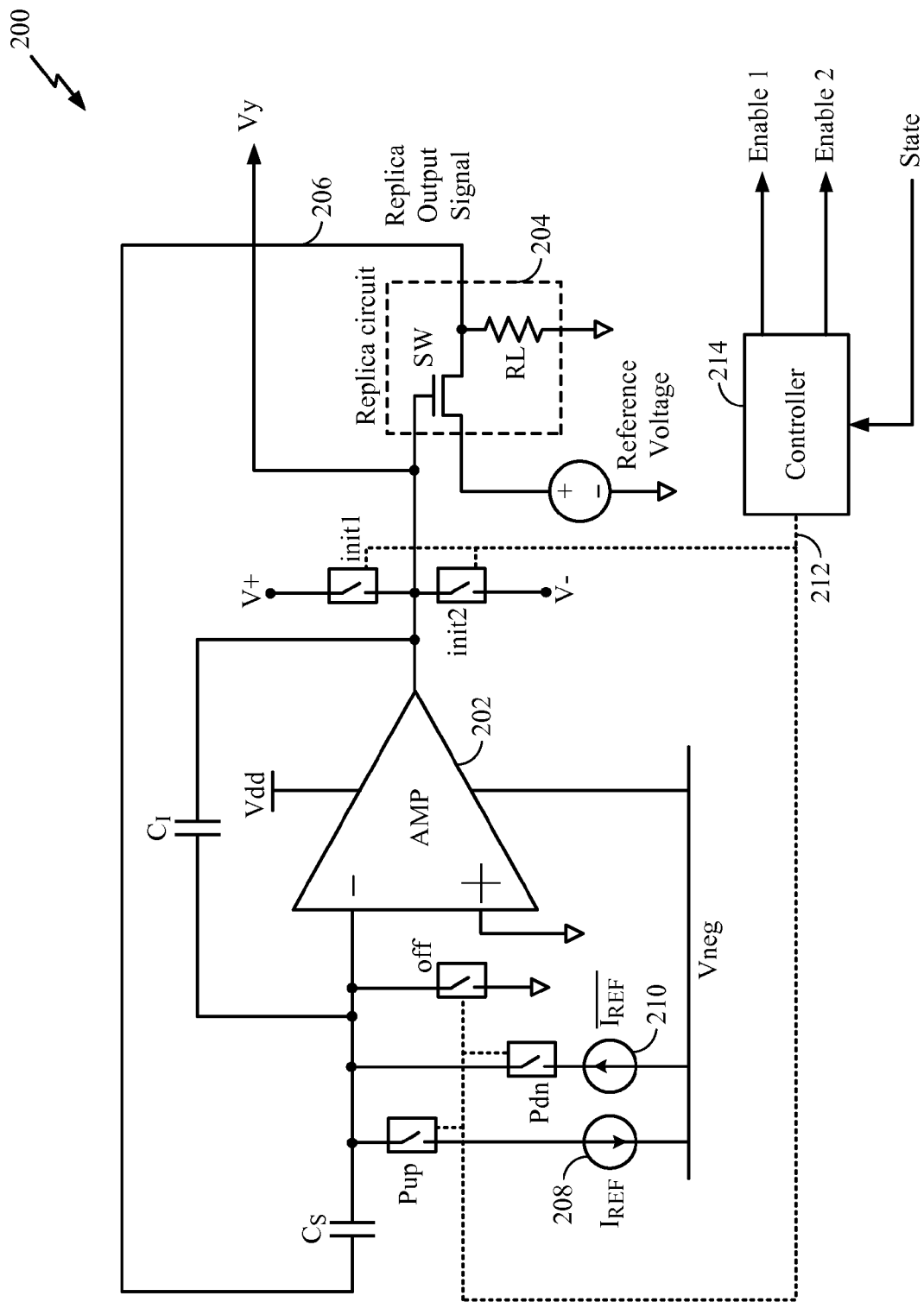
FIG. 2 shows an exemplary waveform generator.

FIG. 2 shows an exemplary waveform generator 200. For example, the waveform generator 200 is suitable for use as the waveform generator 120 shown in FIG. 1. The waveform generator 200 comprises an amplifier 202 coupled to receive an input signal at its inverting input and produce at its output the coupling waveform Vy. The coupling waveform Vy is input to the signal coupler 118.

A replica circuit 204 receives the coupling waveform Vy and generates a replica output signal 206. The replica output signal 206 is input to capacitor Cs and forms part of the input signal that is input to the inverting input (−) of the amplifier 202. The replica circuit 204 comprises transistor (SW) having a gate terminal connected to receive the coupling waveform Vy and a drain terminal connected to receive a reference voltage. The transistor SW also comprises a source terminal connected to a load resistor RL and to output the replica output signal 206.

The coupling waveform Vy is also input to a first terminal of an inner loop feedback capacitor $C_I$. A second terminal of capacitor $C_I$ is connected to the inverting input of the amplifier 202.

Two initialization switches (init1 and init2) are connected to receive the coupling waveform Vy and operate to set an initial voltage levels for the coupling waveform Vy. For example, the init1 switch is also connected to receive a positive voltage supply and is used to initialize the coupling waveform Vy to this positive voltage supply level. The init2 switch is connected to receive a negative voltage supply and is used to initialize the coupling waveform Vy to this negative voltage supply level.

Additional switches are connected to the inverting input of the amplifier 202. An off switch is provided that selectively connects the inverting input to ground, thereby disabling the operation of the amplifier 202. A pull-up switch is provided that selectively connects the inverting input to a reference current 208 that sinks current from the inverting input of the amplifier 202. A pull-down switch is provided that selectively connects the inverting input to a reference current 210 that injects current into the inverting input of the amplifier 202. The operation of the pull-up and pull-down switches is determined based on whether a startup or shutdown operation is being performed. The operation of the switches is controlled by one or more switch control signals 212 that are output from controller 214.

The controller 214 comprises a processor, CPU, memory, and/or hardware (not shown) and operates to generate the one or more switch control signals 212 that control the switches shown in FIG. 2. The controller 214 also generates the Enable 1 and Enable 2 signals that are used to enable/disable the main 106 and secondary 108 output stages shown in FIG. 1. In one implementation, the controller 214 receives a state signal from an external circuit that indicates a desired state or operation of the amplifier circuit 100. For example, the state signal may indicate that start-up or shut-down operation is desired. The controller 214 generates the enables and switch control signals based on the state signal. A more detailed description of the operation of the controller 214 is provided below.

Figure 3:
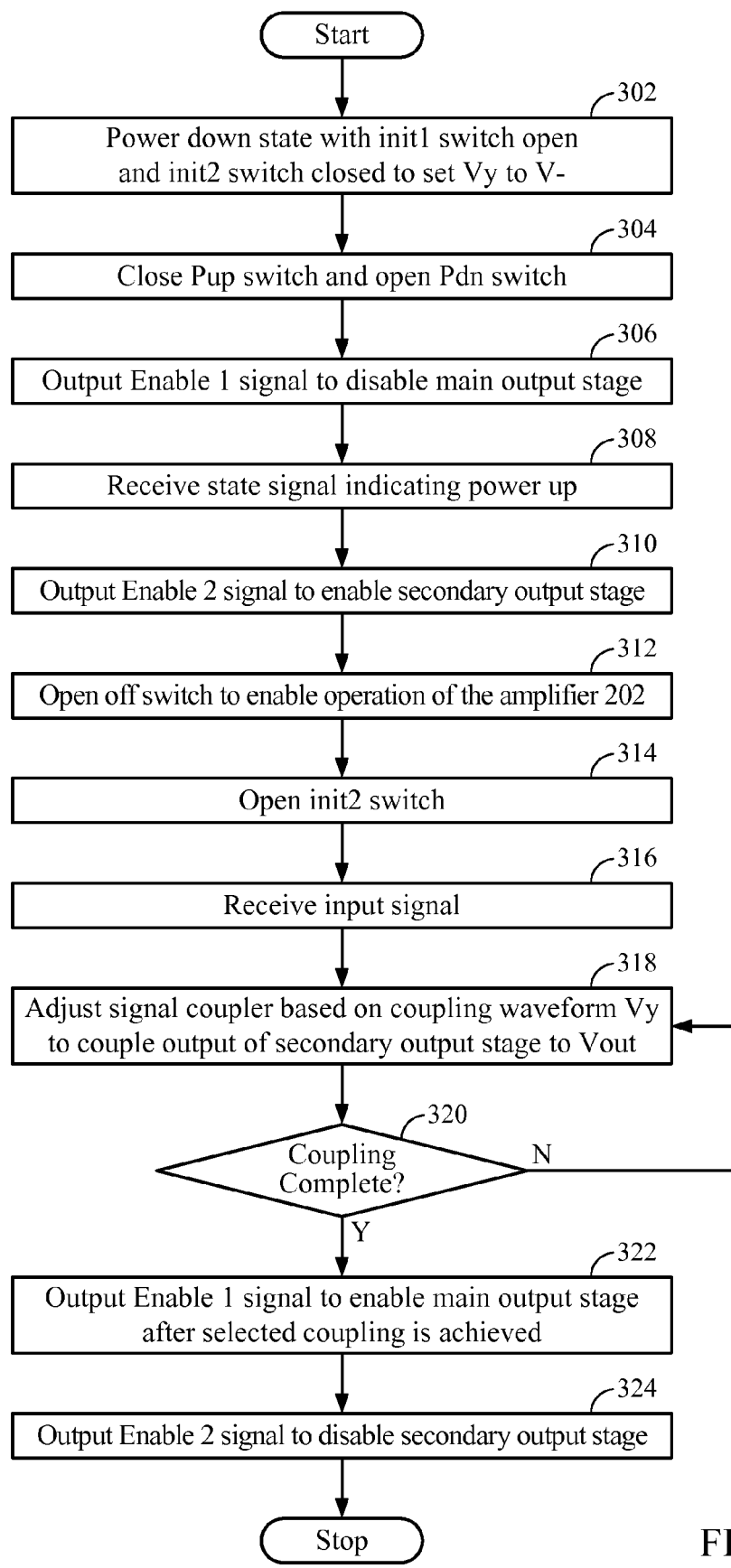
FIG. 3 shows an exemplary method for reducing noise associated with amplifier start-up.

FIG. 3 shows an exemplary method 300 for reducing noise associated with amplifier start-up. For example, the method 300 is suitable for use with the amplifier circuit 100 shown in FIG. 1 and the waveform generator 200 shown in FIG. 2. It will be assumed that prior to start-up, the main output stage 106 and secondary output stage 108 are disabled, and the signal coupler 118 is set its maximum resistance value.

At block 302, the circuit 100 is in a power down state with init1 switch open and init2 switch closed to set the coupling waveform Vy to a value of V−, which operates to set the signal coupler 118 to its maximum resistance value. In an aspect the controller 214 operates to set the init1 and init2 switch settings.

At block 304, the Pup switch is closed and the Pdn switch is open to allow the waveform generator to generate a power up waveform. In an aspect, the controller 214 operates to set the Pup and Pdn switch settings.

At block 306, the Enable 1 signal is set to disable the main output stage. For example, the controller 214 operates to set the Enable 1 signal to disable the main output stage.

At block 308, a state signal is received indicating that the amplifier circuit 100 is to power-up to amplify an input signal. In an aspect, the controller 214 receives the state signal from another processing entity at a device.

At block 310, the Enable 2 signal is set to enable the secondary output stage. For example, the controller 214 operates to set the Enable 2 signal to enable the secondary output stage.

At block 312, the off switch of the waveform generator is opened to enable generation of the coupling waveform Vy. For example, the controller 214 operates to output the switch control signals 212 to set the off switch to enable generation of the coupling waveform Vy.

At block 314, the init2 switch is opened to allow the coupling waveform Vy to ramp up to control the signal coupler 118. For example, the controller 214 operates to set the init2 switch to allow the coupling waveform Vy to ramp up to control the signal coupler 118.

At block 316, an input signal to be amplified is received. For example, the input signal may be an audio signal that is to be amplified for use with an audio headset. In one implementation, the input signal is generated by the source 110 and coupled to the resistors 122 and 124.

At block 318, the signal coupler is controlled based on the coupling waveform Vy to couple the output of the secondary output stage 108 to the Vout terminal 114.

At block 320, a determination is made as to whether the coupling of the output of the secondary output stage 108 to Vout 114 is complete. For example, the coupling may occur for a selected coupling time interval or may occur until a particular threshold value is reached. If the coupling is not complete, the method proceeds to block 318. If the coupling is complete, the method proceeds to block 322.

At block 322, the main output stage is enabled. For example, the controller 214 generates the Enable 1 signal to enable the main output stage 106 after the signal coupler 118 has reached its fully coupled setting. For example, in the fully coupled setting, the signal coupler 118 is set to its minimum resistance value.

At block 324, the secondary output stage is disabled. For example, the controller 214 generates the Enable 2 signal to disable the secondary output stage 108.

Thus, the method 300 is performed during start-up to amplify an input signal while reducing noise. For example, in an exemplary embodiment, the method operates such that the output of the secondary output stage 108 is gradually coupled to the main output stage 106 (Vout) during start up so that the level of clicks, pops, and/or other noise is reduced. After an initial coupling time interval, the main output stage 106 of the amplifier is enabled and the secondary output stage 108 is disabled.

Figure 4:
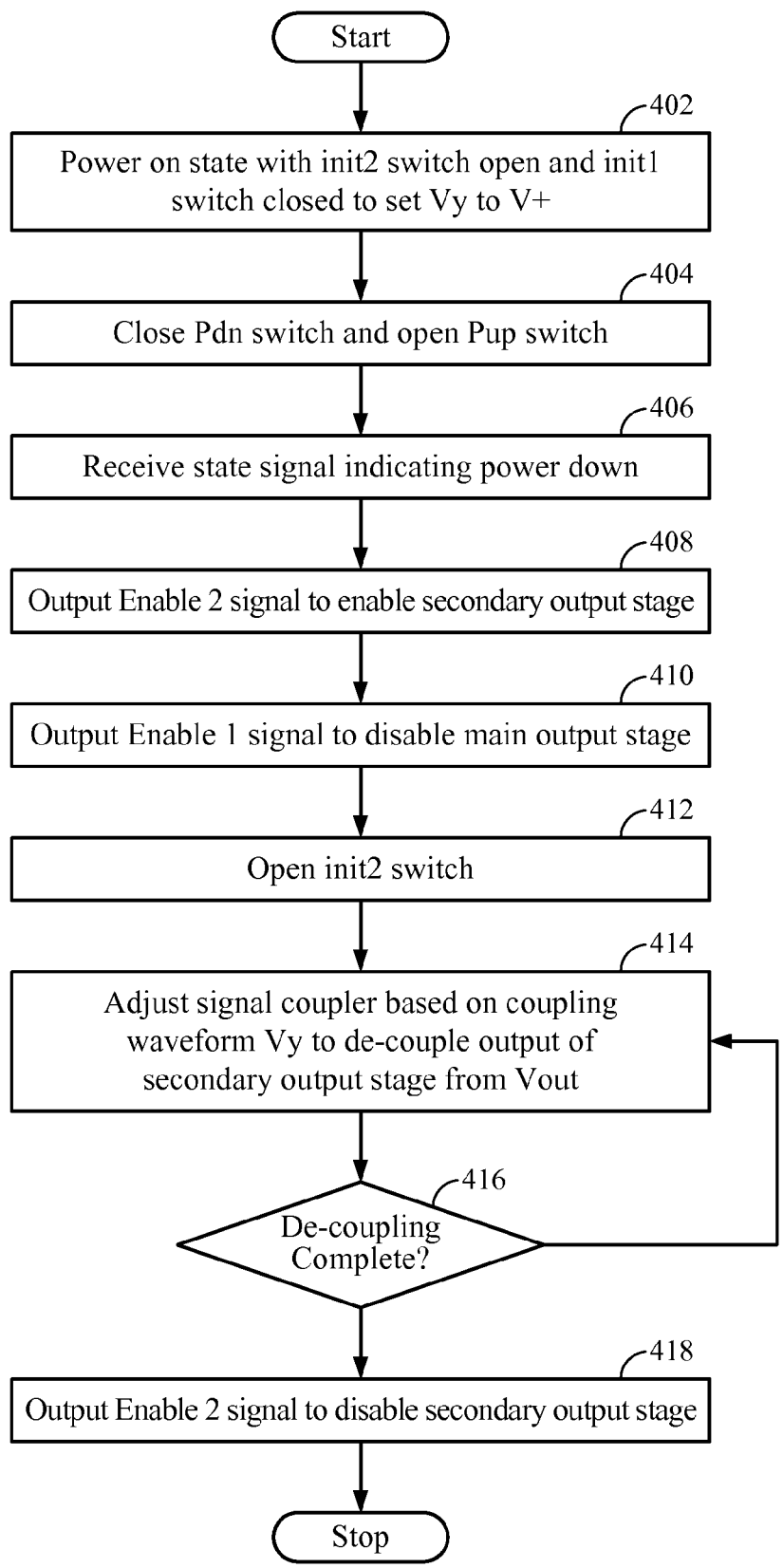
FIG. 4 shows an exemplary method for reducing noise associated with amplifier shut-down.

FIG. 4 shows an exemplary method 400 for reducing noise associated with amplifier shut-down. For example, the method 400 is suitable for use with the amplifier circuit 100 shown in FIG. 1 and the waveform generator 200 shown in FIG. 2. It will be assumed that prior to shut down, the main output stage 106 is enabled, the secondary output stage 108 is disabled, and the signal coupler 118 is set to provide its minimum resistance value.

At block 402, in the power-on state, the init2 switch is set open and the init1 switch is closed to set the coupling signal Vy to V+ to set the signal coupler to its minimum resistance value. For example, the controller 214 operates to set the init1 switch to the closed position.

At block 404, the switch Pdn is closed and the switch Pup is opened. This switch configuration sets the waveform generator 200 to generate the coupling waveform Vy to perform an amplifier power down function.

At block 406, a state signal is received indicating that power down of the amplifier is desired. For example, the controller 214 operates to receive the state signal indicating that amplifier power down is desired.

At block 408, the Enable 2 signal is set to enable the secondary output stage. For example, the controller 214 generates the Enable 2 signal to enable the secondary output stage 108.

At block 410, the Enable 1 signal is set to disable the main output stage. For example, the controller 214 generates the Enable 1 signal to disable the main output stage 106.

At block 412, the init2 switch is opened to allow generation of the coupling waveform Vy. For example, the controller 214 generates the switch control signal 212 to open the init2 switch.

At block 414, the signal coupler is controlled based on the coupling waveform Vy to de-couple the output of the secondary output stage 108 from Vout 114.

At block 416, a determination is made as to whether the de-coupling of the output of the secondary output stage 108 to Vout 114 is complete. For example, the de-coupling may occur for a selected de-coupling time interval or may occur until a particular threshold value is reached. If the de-coupling is not complete, the method proceeds to block 414. If the de-coupling is complete, the method proceeds to block 418.

At block 418, the secondary output stage is disabled. For example, the controller 214 generates the Enable 2 signal to disable the secondary output stage 108.

Thus, the amplifier circuit 100 operates to reduce noise during amplifier shut down. For example, in an exemplary embodiment, the output of the secondary output stage 108 is gradually de-coupled from the main output stage 106 (Vout) during shut down so that the level of clicks, pops, and/or other noise is reduced.

Figure 5:
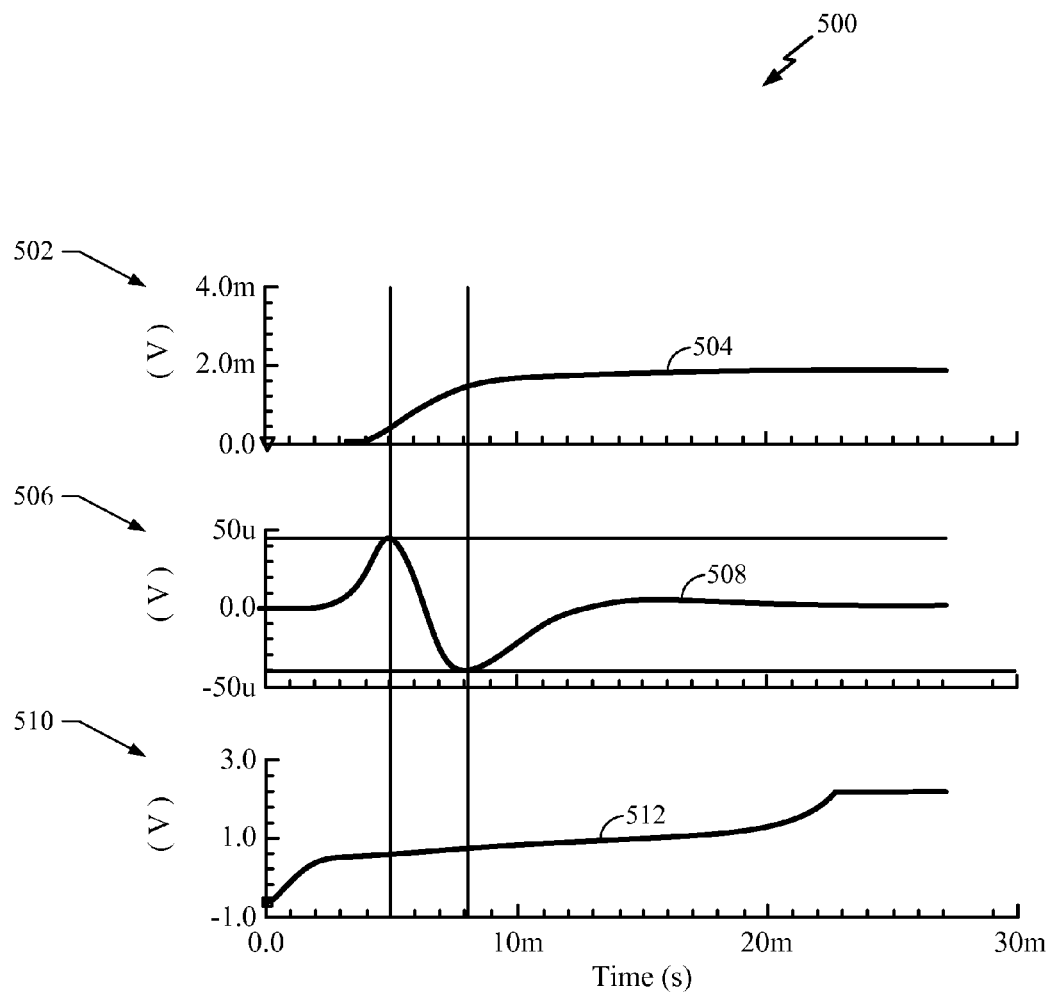
FIG. 5 shows exemplary graphs illustrating how a secondary output stage is coupled to a main output stage in accordance with the various embodiments.

FIG. 5 shows exemplary graphs 500 illustrating the operation of the amplifier circuit 100 during startup in accordance with the various embodiments. For example, the graphs 500 illustrate operation of the amplifier circuit 100 during power up.

A first graph 502 comprises milliseconds on a horizontal axis and millivolts on a vertical axis. A plot line 504 represents the output voltage measured at output terminal 114.

A second graph 506 comprises milliseconds on a horizontal axis and microvolts on a vertical axis. A plot line 508 represents Vnout, which represents the peak-to-peak A-weighted noise at the output terminal 114, which is an industry standard method used to measure click and pop noise.

A third graph 510 comprises milliseconds on a horizontal axis and volts on a vertical axis. A plot line 512 represents the coupling waveform Vy.

Thus, the graphs 500 illustrate how the waveform Vy operates to couple the secondary output to the main output over a selected coupling time interval to reduce and/or eliminate noise, such as click and pop noise, on the amplified output during startup. It should be noted that, in one implementation, the waveforms associated with shutdown are simply a time-reversed version of startup waveforms.

Figure 6:
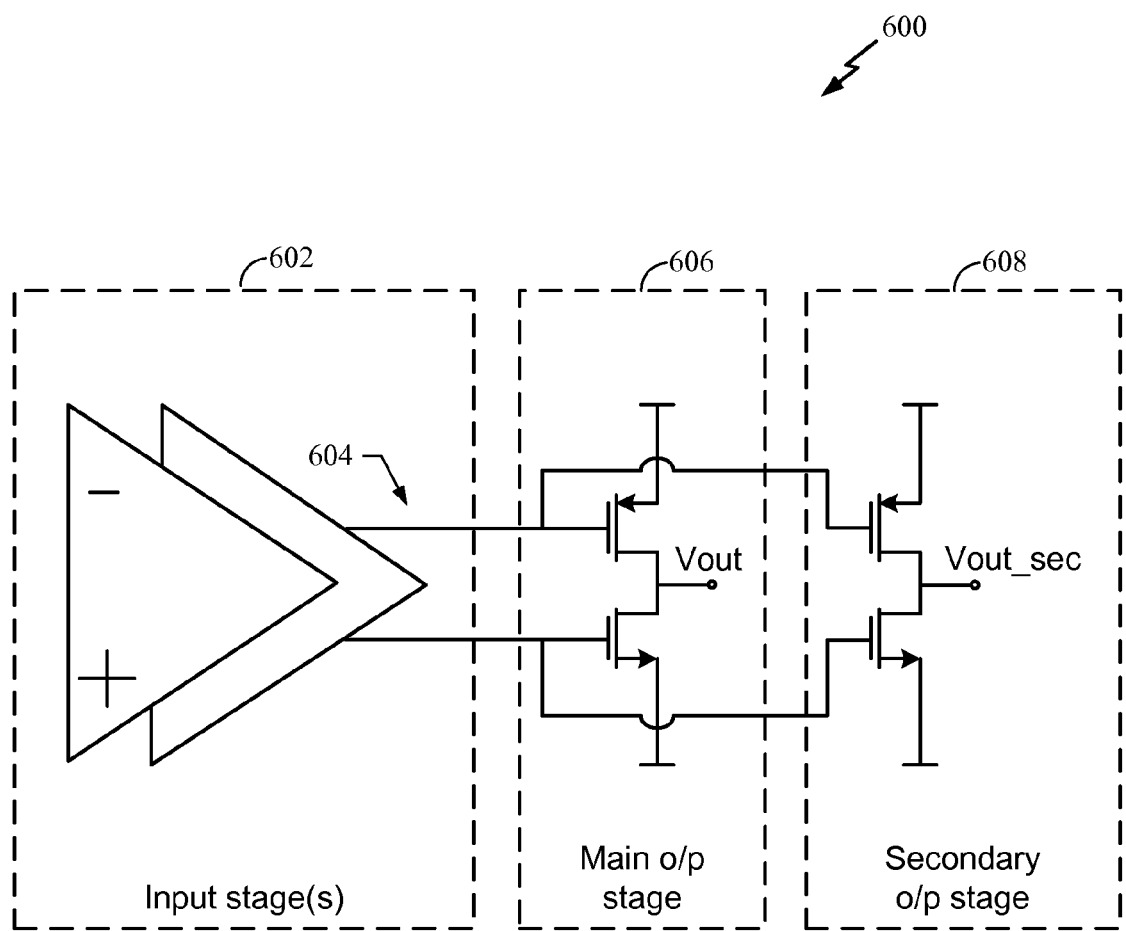
FIG. 6 shows an exemplary amplifier circuit configured for providing signal amplification with reduced noise.

FIG. 6 shows an exemplary amplifier circuit 600 configured for providing amplification with reduced noise. For example, the circuit 600 is suitable for use as the amplifier 102 shown in FIG. 1. The circuit 600 comprises one or more input stages 602 that receive and input signal to be amplified and produce an intermediate signal 604. The intermediate signal 604 is input to both of a main output stage 606, and a secondary output stage 608. The main output stage 606 outputs the amplified signal Vout. The secondary output stage 608 outputs a copy of the amplified signal Vout_sec. In various implementations, the outputs of the main 606 and secondary 608 output stages are combined by the signal coupler 118 shown in FIG. 1 to provide reduced click and pop noise during amplifier startup and shutdown.

Figure 7:
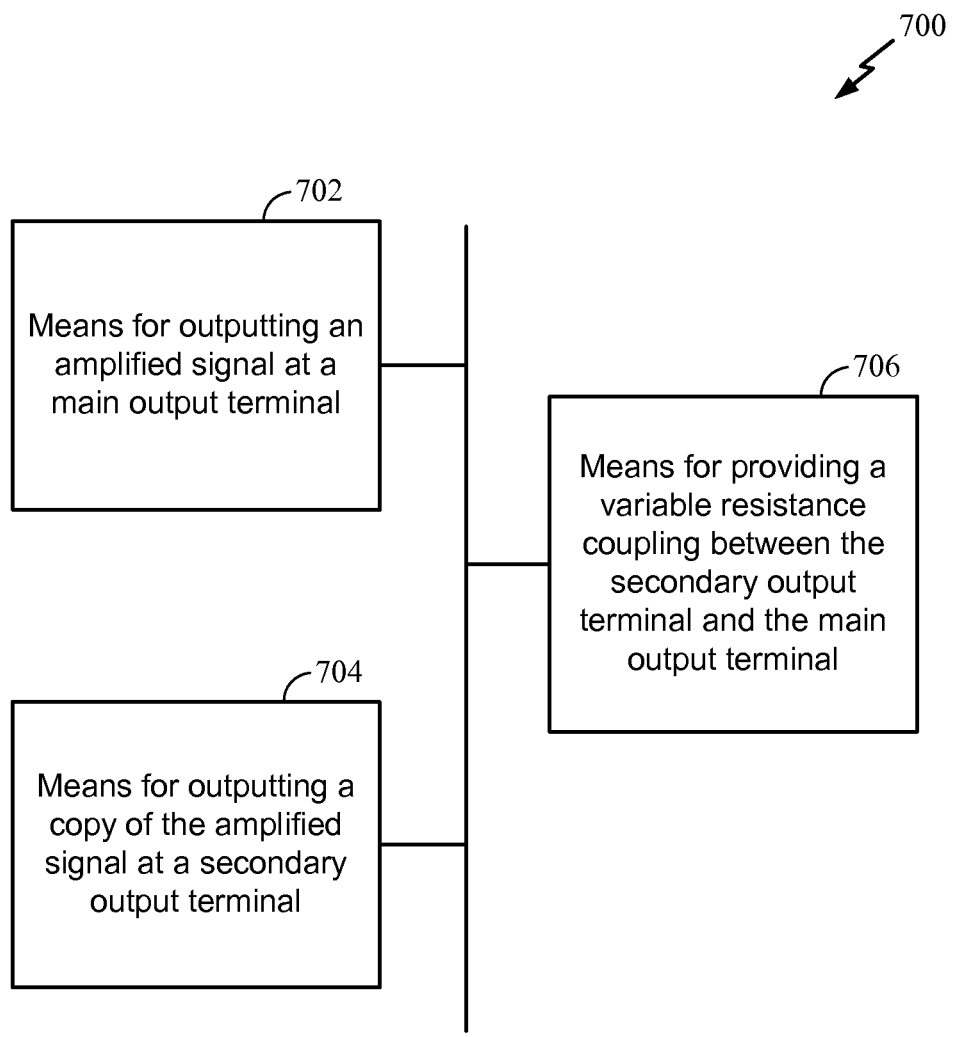
FIG. 7 shows an amplifier apparatus configured to operate with reduced noise.

FIG. 7 shows an amplifier apparatus 700 configured to operate with reduced noise. For example, the apparatus 700 is suitable for use to amplify signal in a user device. In an aspect, the apparatus 700 is implemented by one or more modules configured to provide the functions as described herein. For example, in an aspect, each module comprises hardware and/or hardware executing software.

The apparatus 700 comprises a first module comprising means (702) for outputting an amplified signal at a main output terminal, which in an aspect comprises the main output stage 106.

The apparatus 700 also comprises a second module comprising means (704) for outputting a copy of the amplified signal at a secondary output terminal, which in an aspect comprises the secondary output stage 108.

The apparatus 700 also comprises a third module comprising means (706) for providing a variable resistance coupling between the secondary output terminal and the main output terminal, which in an aspect comprises the signal coupler 118.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software executed by a processor, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
a main output stage configured to output an amplified signal at a main output terminal;
a secondary output stage configured to output a copy of the amplified signal at a secondary output terminal; and
a signal coupler configured to provide a continuously variable resistance coupling between the secondary output terminal and the main output terminal, wherein the continuously variable resistance coupling is varied based on a coupling waveform.

2. The apparatus of claim 1, the coupling waveform configured to control the continuously variable resistance coupling to reduce noise at the main output terminal.

3. The apparatus of claim 2, further comprising a waveform generator configured to output the coupling waveform.

4. The apparatus of claim 3, the waveform generator comprising:
an amplifier configured to output the coupling waveform; and
a replica circuit configure to receive the coupling waveform and output a replica output signal that is coupled to an inverting input of the amplifier.

5. The apparatus of claim 4, further comprising a power up switch configured to couple a reference current to the inverting input to initiate a power up function.

6. The apparatus of claim 4, further comprising a power down switch configured to couple a reference current to the inverting input to initiate a power down function.

7. The apparatus of claim 1, further comprising at least one input stage configured to receive an input signal and amplify the input signal to generate an intermediate signal that is input to the main output stage and the secondary output stage.

8. The apparatus of claim 7, further comprising a feedback resistance coupled between the secondary output terminal and an inverting input of the at least one input stage.

9. The apparatus of claim 1, further comprising a controller configured to output a first enable signal to selectively enable the main output stage and a second enable signal to selectively enable the secondary output stage.

10. An apparatus comprising:
means for outputting an amplified signal at a main output terminal;
means for outputting a copy of the amplified signal at a secondary output terminal; and
means for providing a continuously variable resistance coupling between the secondary output terminal and the main output terminal, wherein the continuously variable resistance coupling is varied based on a coupling waveform.

11. The apparatus of claim 10, the coupling waveform configured to adjust the continuously variable resistance coupling to reduce noise at the main output terminal.

12. The apparatus of claim 11, further comprising means for generating the coupling waveform.

13. The apparatus of claim 12, the means for generating comprising:
means for amplifying an input signal to generate the coupling waveform; and
means for generating a replica output signal based on the coupling waveform, the replica output signal is coupled to the input signal.

14. The apparatus of claim 13, further comprising means for coupling a reference current to the input signal to initiate a power up function.

15. The apparatus of claim 13, further comprising means for coupling a reference current to the input signal to initiate a power down function.

16. The apparatus of claim 10, further comprising means for amplifying an input signal to generate an intermediate signal that is input to both of the means for outputting.

17. The apparatus of claim 10, further comprising:
means for generating a first enable signal to selectively enable the means for outputting the amplified signal at the main output terminal; and
means for generating a second enable signal to selectively enable the means for outputting the copy of the amplified signal at the secondary output terminal.

18. A method for reducing amplifier noise during a power up operation, the method comprising:
disabling a main output stage configured to output an amplified signal at a main output terminal;
enabling a secondary output stage configured to output a copy of the amplified signal at a secondary output terminal;
varying a continuously variable resistance coupling that couples the secondary output terminal to the main output terminal based on a coupling waveform to perform the power up operation;
waiting for said coupling to complete;
enabling the main output stage; and
disabling the secondary output stage.

19. A method for reducing amplifier noise during a power down operation, the method comprising:
enabling a secondary output stage configured to output a copy of an amplified signal;
disabling a main output stage configured to output the amplified signal;
varying a continuously variable resistance coupling to de-couple the secondary output stage from the main output stage based on a coupling waveform to perform the power down operation;
waiting for said de-coupling to complete; and
disabling the secondary output stage.

20. A computer program product, comprising:
a non-transitory computer readable medium embodying instructions executable by a processor to:
disable a main output stage configured to output an amplified signal at a main output terminal;
enable a secondary output stage configured to output a copy of the amplified signal at a secondary output terminal;
vary a continuously variable resistance coupling to couple the secondary output terminal to the main output terminal based on a coupling waveform to perform the power up operation;
enable the main output stage; and
disable the secondary output stage.

* * * * *